US008258485B2

(12) United States Patent
Levesque et al.

(10) Patent No.: US 8,258,485 B2
(45) Date of Patent: Sep. 4, 2012

(54) SOURCE-COLLECTOR MODULE WITH GIC MIRROR AND XENON LIQUID EUV LPP TARGET SYSTEM

(75) Inventors: Richard A. Levesque, Livermore, CA (US); Natale M. Ceglio, Pleasanton, CA (US); Giovanni Nocerino, Pleasanton, CA (US); Fabio Zocchi, Samarate (IT)

(73) Assignee: Media Lario SRL, Bosisio Parini (IT)

( * ) Notice: Subject to any disclaimer, the term of this patent is extended or adjusted under 35 U.S.C. 154(b) by 159 days.

(21) Appl. No.: 12/807,165

(22) Filed: Aug. 30, 2010

(65) Prior Publication Data

US 2012/0050704 A1    Mar. 1, 2012

(51) Int. Cl.
*H01J 37/20* (2006.01)
(52) U.S. Cl. .................. 250/432 R; 250/504 R
(58) Field of Classification Search ............. 250/432 R, 250/434
See application file for complete search history.

(56) References Cited

U.S. PATENT DOCUMENTS

| 7,399,981 | B2 * | 7/2008 | Cheymol et al. | 250/504 R |
| 7,872,245 | B2 * | 1/2011 | Vaschenko et al. | 250/492.2 |
| 2009/0303450 | A1 * | 12/2009 | Hintersteiner | 355/30 |

OTHER PUBLICATIONS

Hansson et al., 'Characterization of a liquid-xenon-jet laser-plasma extreme-ultraviolet source', Jun. 2004, Rev. Sci. Instrum., vol. 75, No. 4, pp. 2122-2129.*

* cited by examiner

*Primary Examiner* — Jack Berman
*Assistant Examiner* — Eliza Osenbaugh-Stewart
(74) *Attorney, Agent, or Firm* — Opticus IP Law PLLC

(57) ABSTRACT

A source-collector module (SOCOMO) for generating a laser-produced plasma (LPP) that emits EUV radiation, and a grazing-incidence collector (GIC) mirror arranged relative to the LPP and having an input end and an output end. The LPP is formed using an LPP target system having a light source portion and a target portion, wherein a pulsed laser beam from the light source portion irradiates Xenon liquid in the target portion. The GIC mirror is arranged relative to the LPP to receive the EUV radiation at its input end and focus the received EUV radiation at an intermediate focus adjacent the output end. A radiation collection enhancement device having at least one funnel element may be used to increase the amount of EUV radiation provided to the intermediate focus and/or directed to a downstream illuminator. An EUV lithography system that utilizes the SOCOMO is also disclosed.

20 Claims, 12 Drawing Sheets

SOURCE-COLLECTOR MODULE WITH GIC MIRROR AND XENON LIQUID EUV LPP TARGET SYSTEM

FIELD

The present disclosure relates generally to grazing-incidence collectors (GICs), and in particular to a source-collector module for use in an extreme ultraviolet (EUV) lithography system that employs a laser-produced plasma (LPP) target system that uses Xenon liquid to generate EUV radiation.

BACKGROUND ART

Laser-produced plasmas (LPPs) are formed in one example by irradiating Sn droplets with a focused laser beam. Because LPPs radiate in the extreme ultraviolet (EUV) range of the electromagnetic spectrum, they are considered to be a promising EUV radiation source for EUV lithography systems.

FIG. 1 is a schematic diagram of a generalized configuration for a prior art LPP-based source-collector module ("SOCOMO") 10 that uses a normal-incidence collector ("NIC") mirror MN, while FIG. 2 is a more specific example configuration of the "LPP-NIC" SOCOMO 10 of FIG. 1. The LPP-NIC SOCOMO 10 includes a high-power laser 12 that generates a high-power, high-repetition-rate laser beam 13 having a focus F13. LPP-NIC SOCOMO 10 also includes along an axis A1 a fold mirror FM and a large (e.g., ~600 mm diameter) ellipsoidal NIC mirror MN that includes a surface 16 with a multilayer coating 18. The multilayer coating 18 is essential to guarantee good reflectivity at EUV wavelengths. LPP-NIC SOCOMO 10 also includes a Sn source 20 that emits a stream of tin (Sn) pellets 22 that pass through laser beam focus F13.

In the operation of LPP-NIC SOCOMO 10, laser beam 13 irradiates Sn pellets 22 as the pellets pass through the laser beam focus F13, thereby produce a high-power LPP 24. LPP 24 typically resides on the order of hundreds of millimeters from NIC mirror MN and emits EUV radiation 30 as well as energetic Sn ions, particles, neutral atoms, and infrared (IR) radiation. The portion of the EUV radiation 30 directed toward NIC mirror MN is collected by the NIC mirror MN and is directed (focused) to an intermediate focus IF to form an intermediate focal spot FS. The intermediate focus IF is arranged at or proximate to an aperture stop AS. Only that portion of the EUV radiation 30 that makes it through aperture stop AS forms focal spot FS. Here is it noted that focus spot FS is not an infinitely small spot located exactly at intermediate focus IF, but rather is a distribution of EUV radiation 30 generally centered at the intermediate focus IF.

Advantages of LPP-NIC SOCOMO 10 are that the optical design is simple (i.e., it uses a single ellipsoidal NIC mirror) and the nominal collection efficiency can be high because NIC mirror MN can be designed to collect a large angular fraction of the EUV radiation 30 emitted from LPP 24. It is noteworthy that the use of the single-bounce reflective NIC mirror MN placed on the opposite side of LPP 24 from the intermediate focus IF, while geometrically convenient, requires that the Sn source 20 not significantly obstruct EUV radiation 30 being delivered from the NIC mirror MN to the intermediate focus IF. Thus, there is generally no obscuration in the LPP-NIC SOCOMO 10 except perhaps for the hardware needed to generate the Sn pellet stream.

LPP-NIC SOCOMO 10 works well in laboratory and experimental arrangements where the LPP-NIC SOCOMO lifetime and replacement cost are not major considerations. However, a commercially viable EUV lithography system requires a SOCOMO that has a long lifetime. Unfortunately, the proximity of the surface 16 of NIC mirror MN and the multilayer coatings 18 thereon to LPP 24, combined with the substantially normally incident nature of the radiation collection process, makes it highly unlikely that the multilayer coating 18 will remain undamaged for any reasonable length of time under typical EUV-based semiconductor manufacturing conditions.

A further drawback of the LPP-NIC SOCOMO 10 is that it cannot be used in conjunction with a debris mitigation tool based on a plurality of radial lamellas through which a gas is flowed to effectively stop ions and neutrals atoms emitted from the LPP 24 from reaching NIC mirror MN. This is because the radial lamellas would also stop the EUV radiation 30 from being reflected from NIC mirror MN.

Multilayer coating 18 is also likely to have its performance significantly reduced by the build-up of Sn, which changes the critical reflective properties of the multilayer coating 18. Also, the aforementioned energetic ions, atoms and particles produced by LPP 24 will bombard multilayer coating 18 and destroy the layered order of the top layers of the multilayer coating 18. In addition, the energetic ions, atoms and particles will erode multilayer coating 18, and the attendant thermal heating from the generated IR radiation can act to mix or interdiffuse the separate layers of the multilayer coating 18.

While a variety of fixes have been proposed to mitigate the above-identified problems with LPP-NIC SOCOMO 10, they all add substantial cost and complexity to module, to the point where it becomes increasingly unrealistic to include it in a commercially viable EUV lithography system. Moreover, the Sn droplet LPP EUV light source is a complex and expensive part of the LPP-NIC SOCOMO 10. What is needed therefore is a less expensive, less complex, more robust and generally more commercially viable SOCOMO for use in an EUV lithography system that uses a simpler and more cost-effective LPP-based EUV radiation source.

SUMMARY

The present disclosure is generally directed to grazing incidence collectors (GICs), and in particular to GIC mirrors used to form a source-collector module (SOCOMO) for use in EUV lithography systems, where the SOCOMO includes a LPP target system that uses Xenon liquid and a laser to generate EUV radiation.

An aspect of the disclosure is a SOCOMO for an EUV lithography system. The SOCOMO includes a laser that generates a pulsed laser beam, and a fold mirror arranged along a SOCOMO axis and configured to receive the pulsed laser beam and reflect the pulsed laser beam down the SOCOMO axis in a first direction. The SOCOMO also includes a Xenon liquid source configured to provide Xenon liquid at an irradiation location where the Xenon liquid is irradiated by the pulsed laser beam, thereby creating a LPP that generates EUV radiation in a second direction that is generally opposite the first direction. The SOCOMO also includes a GIC mirror having an input end and an output end and arranged to receive the EUV radiation at the input end and focus the received EUV radiation at an intermediate focus adjacent the output end.

Another aspect of the disclosure is a method of collecting EUV radiation from a LPP. The method includes providing a GIC mirror along an axis, the GIC mirror having input and output ends. The method also includes arranging adjacent the input end of GIC mirror an LPP target system configured to provide Xenon liquid, and moving the Xenon liquid past an irradiation location. The method further includes sending a pulsed laser beam down the axis of GIC mirror and through the GIC mirror from the output end to the input end and to the Xenon liquid at the irradiation location, thereby forming the LPP that emits the EUV radiation. The method also include collecting with the GIC mirror at the input end of GIC mirror a portion of the EUV radiation from the LPP and directing the collected EUV radiation out of the output end of GIC mirror to form a focus spot at an intermediate focus.

Additional features and advantages of the disclosure are set forth in the detailed description below, and in part will be readily apparent to those skilled in the art from that description or recognized by practicing the disclosure as described herein, including the detailed description which follows, the claims, as well as the appended drawings.

Figure 1:
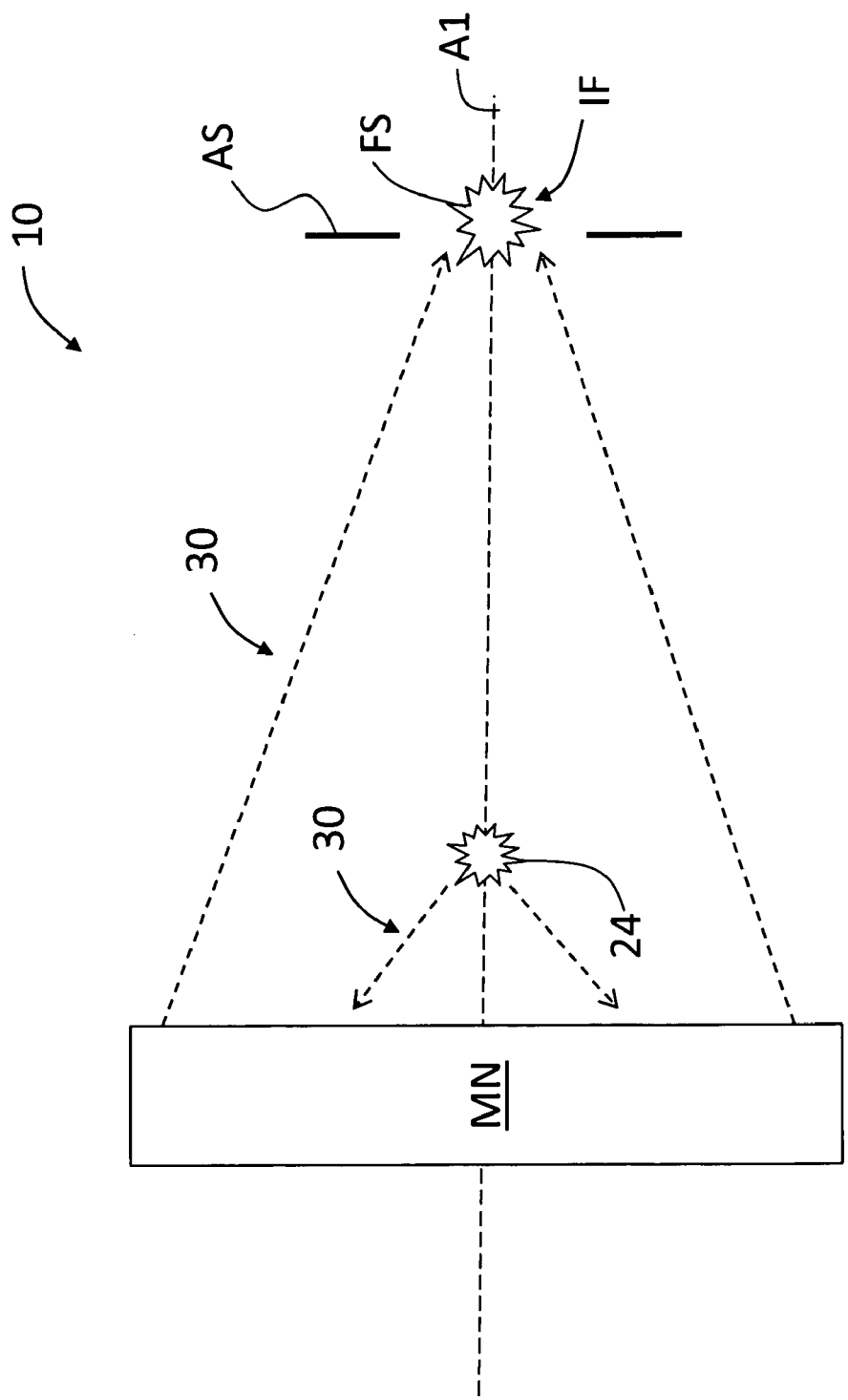
FIG. 1 is a schematic diagram of a generalized example prior art LPP-NIC SOCOMO.
Figure 2:
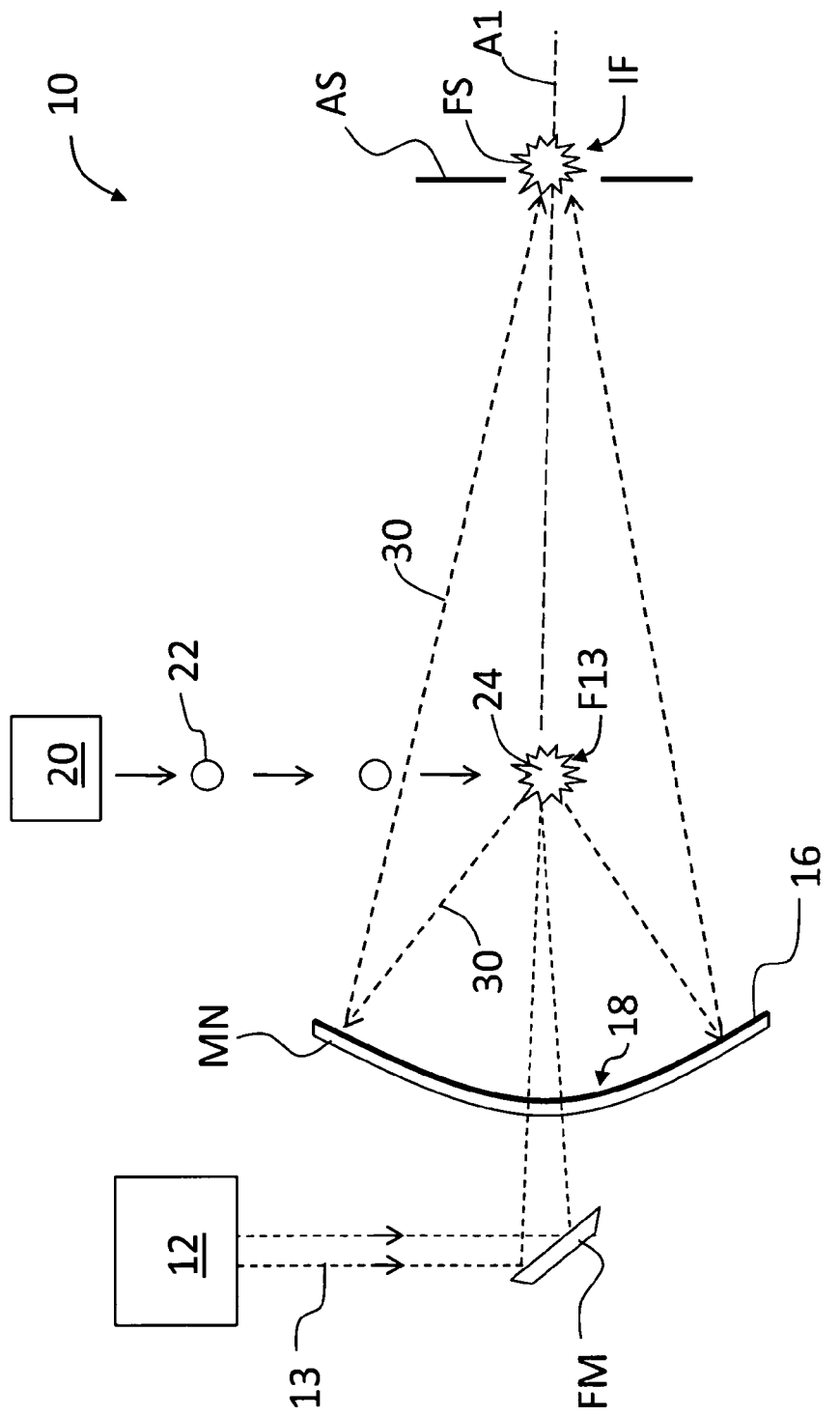
FIG. 2 is a schematic diagram of a particular example of a prior art LPP-NIC SOCOMO in accordance with FIG. 1.

The various elements depicted in the drawing are merely representational and are not necessarily drawn to scale. Certain sections thereof may be exaggerated, while others may be minimized. The drawing is intended to illustrate an example embodiment of the disclosure that can be understood and appropriately carried out by those of ordinary skill in the art.

DETAILED DESCRIPTION

The present disclosure is generally directed to GICs, and in particular to GIC mirrors used to form a source-collector module (SOCOMO) for use in EUV lithography systems that have a LPP-based EUV light source.

Figure 3A:
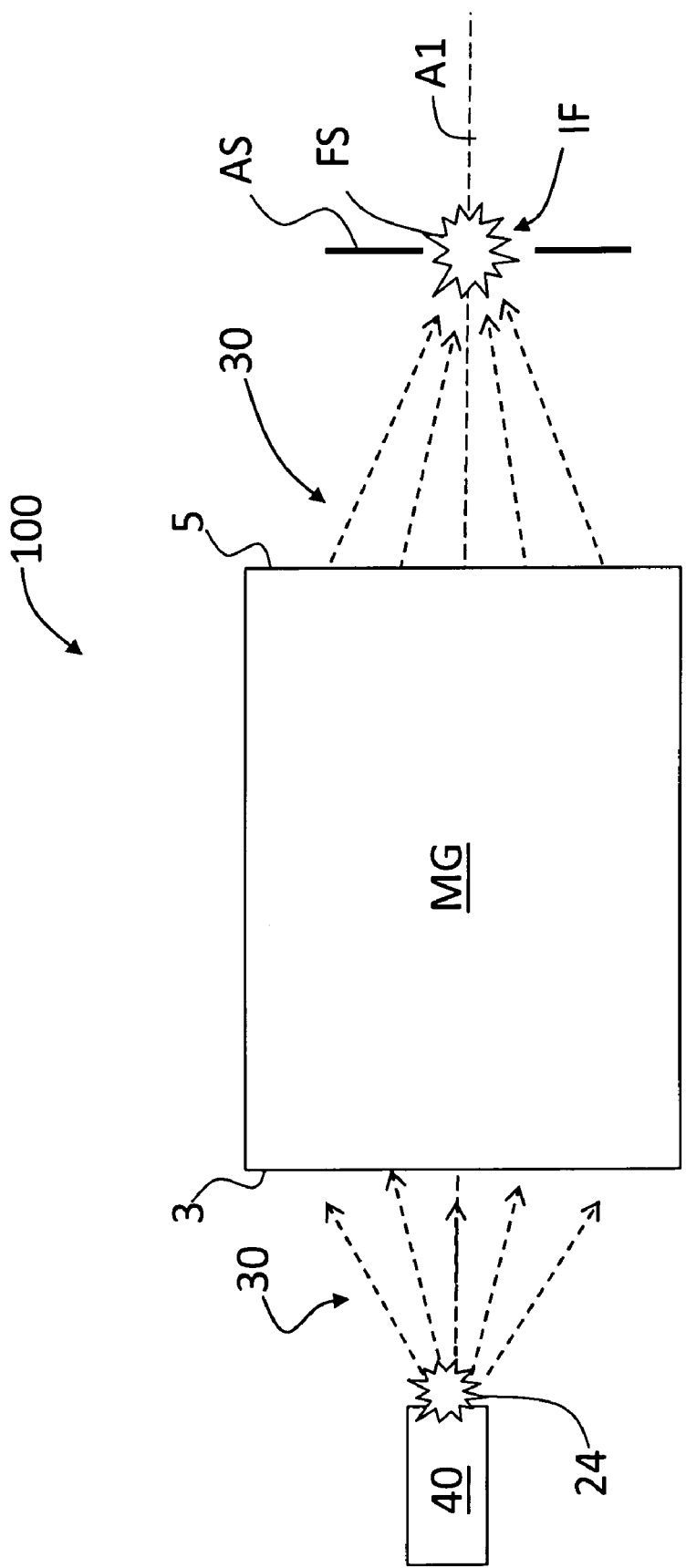
FIG. 3A is a generalized schematic diagram of an example GIC-based SOCOMO for an LPP source ("LPP-GIC SOCOMO"), wherein the LPP and intermediate focus are on opposite sides of the GIC mirror.
Figure 3B:
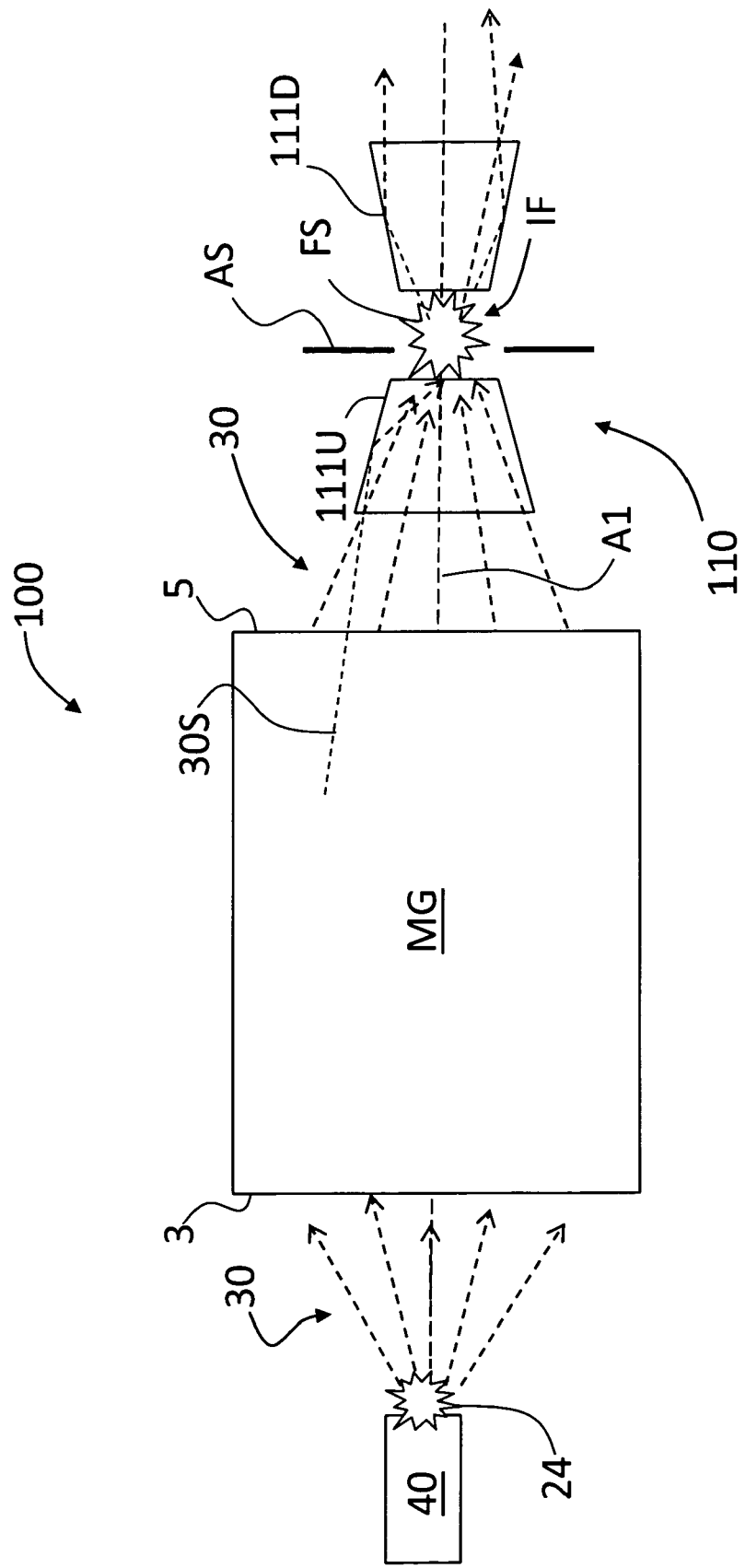
FIG. 3B is similar to FIG. 3A, wherein the LPP-GIC SOCOMO additionally includes an optional radiation collection enhancement device (RCED) arranged between the GIC mirror and the intermediate focus with the example RCED having upstream and downstream funnel elements on respective sides of the intermediate focus.

FIG. 3A and FIG. 3B are generalized schematic diagrams of example LPP-GIC SOCOMOs 100, wherein LPP 24 and intermediate focus IF are on opposite sides of a GIC mirror MG. GIC mirror MG has an input end 3 and an output end 5. An LPP target system 40 that generates LPP 24 is also shown, and an example of the LPP target system 40 is discussed in detail below. In FIG. 3B, LPP-GIC SOCOMO 100 further includes an optional radiation collection enhancement device (RCED) 110, such as described in U.S. Provisional Patent Application Ser. No. 61/341,806 entitled "EUV collector system with enhanced EUV radiation collection," which application is incorporated by reference herein. RCED 110 is arranged along optical axis A1 immediately adjacent intermediate focus IF and aperture stop AS on the side of GIC mirror MG and is configured to increase the amount of EUV radiation 30 that makes it through the aperture stop AS to the intermediate focus IF to form focus spot FS. This is illustrated by a skew EUV ray 30S that is redirected by RCED 110 through aperture stop AS to form focus spot FS.

In an example embodiment, RCED 110 includes an inverted funnel-like element (i.e., a downstream funnel element) 111D arranged downstream of intermediate focus IF and configured to direct EUV radiation 30 from intermediate focus IF to a downstream position, such as to the illumination optics (see FIG. 10, introduced and discussed below). Such an embodiment can be effective in making the projected EUV radiation 30 at a downstream illuminator more uniform and thereby better utilized at the reticle plane. RCED 110 may include upstream and downstream funnel elements 111U and 111D, where upstream and downstream here are defined relative to intermediate image IF. RCED 110 may include just the upstream funnel element 111U (see e.g., FIG. 4) or just the downstream funnel element 111D. In another example, RCED 110 is a continuous (monolithic) element that combines the upstream and downstream funnel elements 111U and 111D to form a single funnel element 111 that has upstream and downstream funnel portions rather than separate elements. In the case where a single funnel element 111 is used, it is simply referred to as RCED 110.

Figure 4:
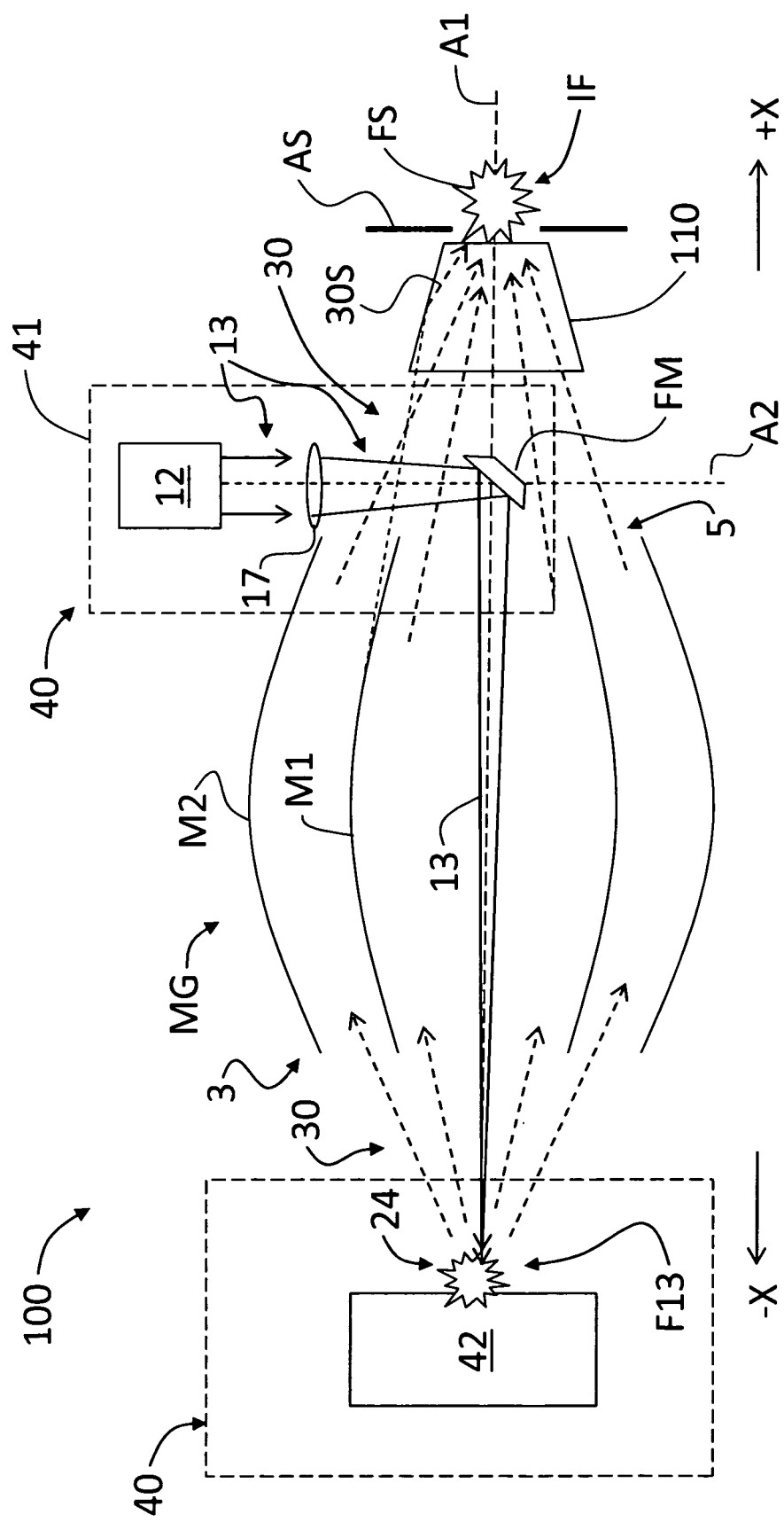
FIG. 4 is a schematic diagram of example LPP-GIC SOCOMO based on the generalized configuration of FIG. 3B, and showing the light source portion and the target portion of the LPP target system.

FIG. 4 is a schematic diagram of an example LPP-GIC SOCOMO 100 based on the general configuration of FIG. 3B. LPP-GIC SOCOMO 100 of FIG. 4 utilizes an LPP target system 40 that includes a light source portion 41 and a target portion 42. Light source portion 41 includes a laser 12 that generates a laser beam 13 along an axis A2 that is perpendicular to optical axis A1. Light source portion 41 also includes a fold mirror FM arranged along optical axis A1 at the intersection of axes A1 and A2, which intersection lies between GIC mirror MG and intermediate focus IF (e.g., between the GIC mirror MG and RCED 110). This allows for a configuration where a multi-shell GIC mirror MG (shown in FIG. 4 has having two GIC mirror shells M1 and M2 by way of example) is arranged along optical axis A1 between LPP 24 and intermediate focus IF. A lens 17 adjacent laser 12 assists in focusing laser beam 13 to a focus F13 at target portion 42 to form LPP 24, as discussed in greater detail below. In an example embodiment, GIC mirror shells M1 and M2 include Ru coatings (not shown) on their respective reflective surfaces.

Target portion 42 is irradiated by laser beam 13 traveling through GIC mirror MG in the −X direction along optical axis A1, thereby creating EUV radiation 30 that is emitted generally in the +X direction. The axial obscuration presented by fold mirror FM is minimal. Thus, laser beam 13 travels in one direction (i.e., the −X direction) through GIC mirror MG generally along optical axis A1 and EUV radiation 30 travels generally in the opposite direction (i.e., the +X direction) through the GIC mirror MG, RCED 110 and to intermediate focus IF.

LPP Target System

Figure 5A:
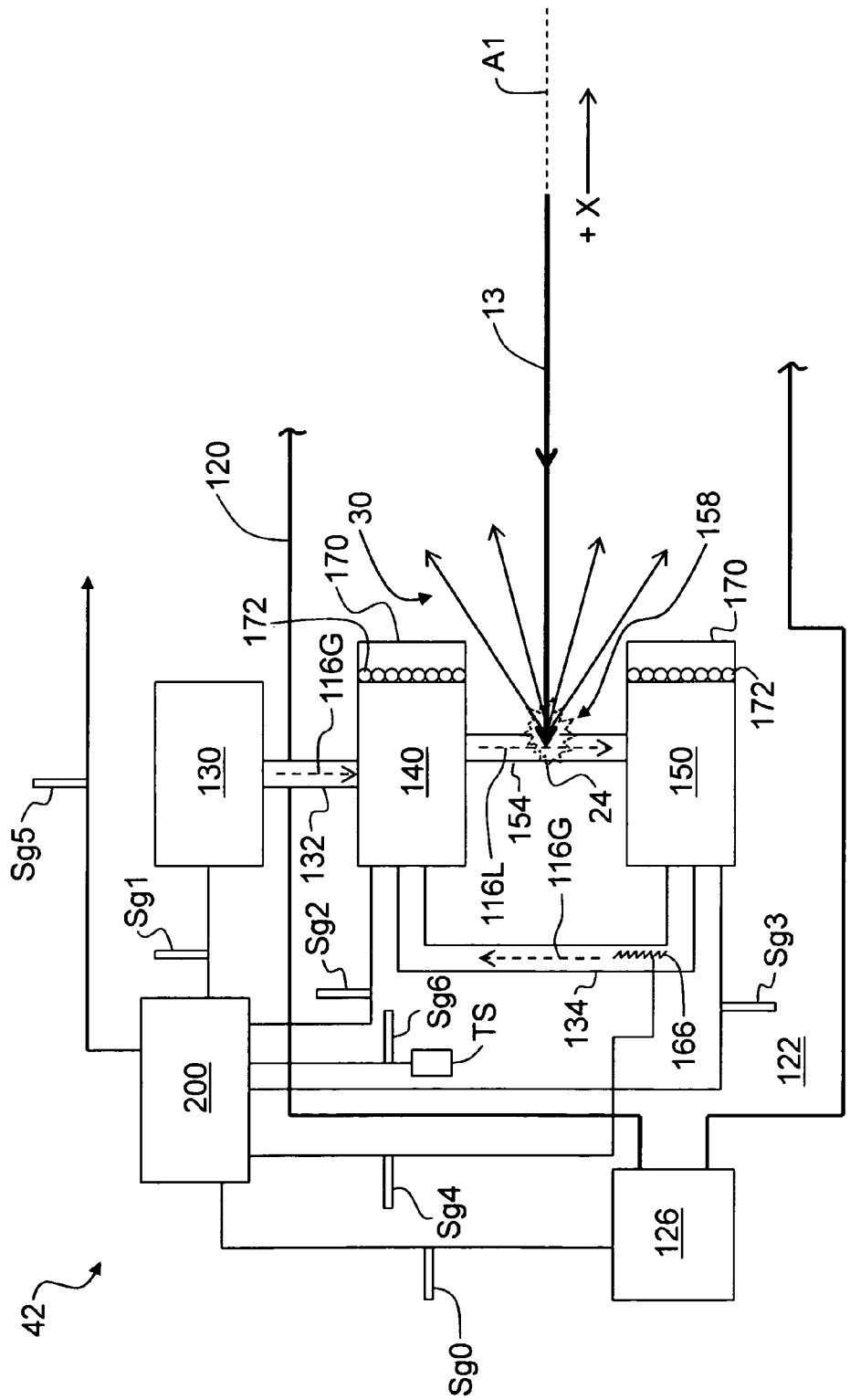
FIG. 5A is a schematic side view of an example target portion of the target system that constitutes a Xenon liquid source for generating EUV radiation.
Figure 5B:
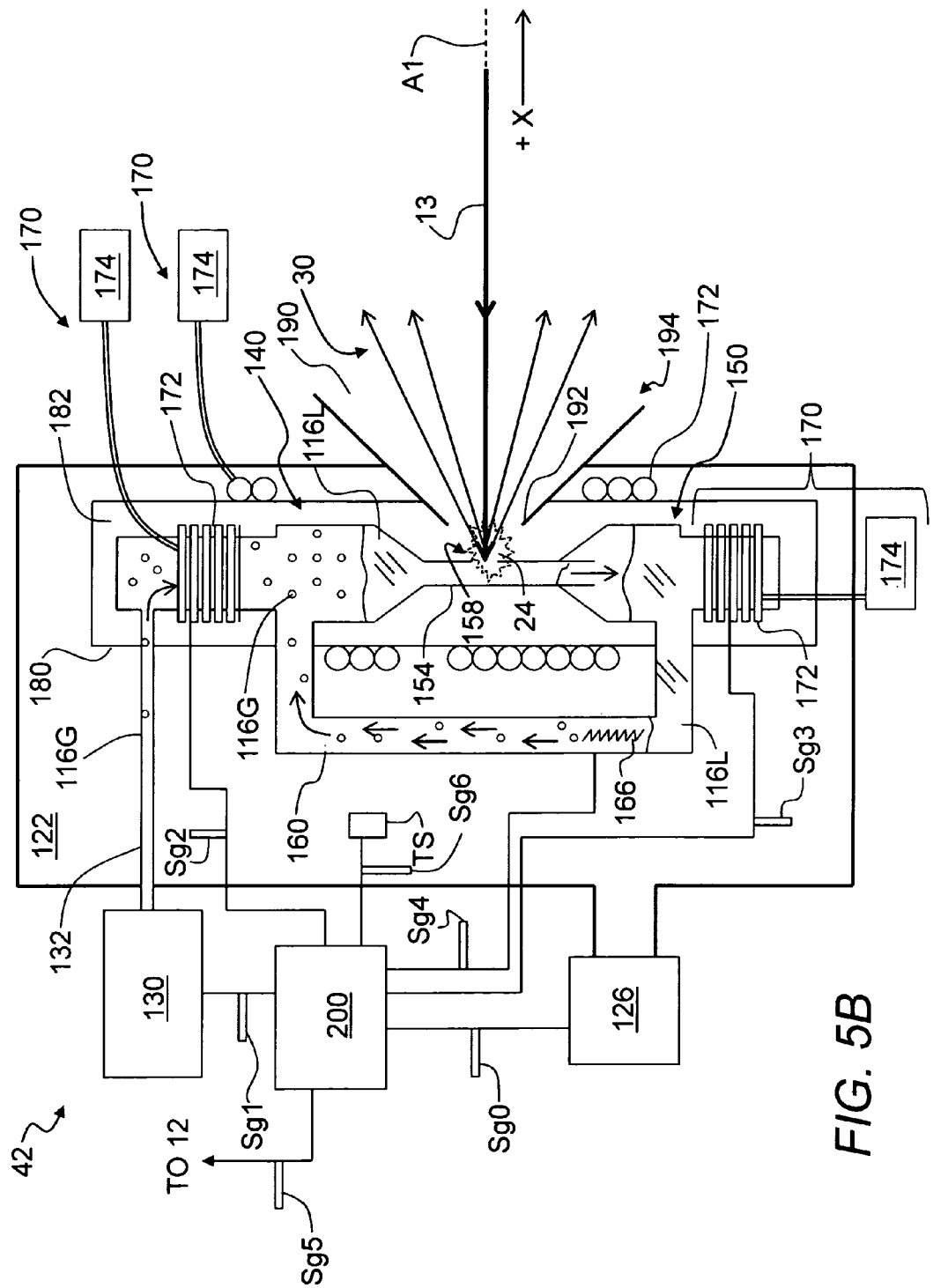
FIG. 5B is a more detailed schematic diagram of an example embodiment of the target portion of FIG. 5A.

FIG. 5A is a schematic side view of an example target portion 42 that constitutes a Xenon liquid source for generating EUV radiation 30. FIG. 5B is a more detailed schematic diagram the target portion 42 of FIG. 5A. Target portion 42 includes a vacuum chamber 120 having an interior 122. A vacuum system 126 is pneumatically coupled to chamber interior 122 and is operable to pull a vacuum therein. Target portion 42 includes a Xenon mass flow system 130 that typically resides outside of vacuum chamber 120, as shown. Xenon mass flow system 130 is configured to provide a metered flow of Xenon gas 116G through a gas flow conduit 132.

Arranged within chamber interior 122 is a Xenon liquefier unit 140 fluidly connected to the Xenon mass flow system 130 via the gas flow conduit 132. Also arranged within chamber interior 122 is a Xenon recovery unit 150 that is fluidly connected to the Xenon liquefier unit 140 via a capillary tube 154 that allows for Xenon fluid 116 to flow from the Xenon liquefier unit 140 to the Xenon recovery unit 150. Capillary tube 154 includes an aperture 158 that allows focused laser beam 13 to be incident upon the Xenon fluid 116 and form EUV radiation 30, as described below.

Xenon liquefier unit 140 and Xenon recovery unit 150 are also fluidly connected via return conduit 160 that allows for Xenon gas 116G to flow from the Xenon recovery unit 150 back to the Xenon liquefier unit 140 to recycle unused Xenon, i.e., Xenon that is not converted to the hot plasma that produces the EUV radiation 30. A heater unit 166 is arranged in return conduit 160 and is operable to convert Xenon liquid 116L to Xenon gas 116G, thereby forming a thermal siphon between the Xenon liquefier unit 140 and the Xenon recovery unit 150. In an example embodiment, Xenon liquefier unit 140 and the Xenon recovery unit 150 have cooling units 170 operably arranged thereon that serve to condense Xenon gas 116G. Example cooling units 170 include respective cooling lines 172 that support the flow of a cooling fluid (not shown) from respective cooling fluid sources 174 (see FIG. 5B). In an example embodiment illustrated in FIG. 5B, the Xenon liquefier unit 140 and the Xenon recovery unit 150 are contained within an interior 182 of containment vessel 180 that also includes a cooling unit 170 that includes cooling lines 172 and a cooling fluid source 174. Only some of cooling lines 172 on containment vessel 180 are shown for ease of illustration.

With reference to FIG. 5B, in an example, an aperture 190 is formed in vacuum chamber 120 and containment vessel 180. In an example, aperture 190 has a conic shape with a narrow end 192 and a wide end 194, with the narrow end at aperture 158. In an example, wide end 194 includes a flange (not shown) for connecting to an adjacent vacuum chamber (not shown) associated with the other components of LPP-GIC SOCOMO 100.

In an example, at least one temperature sensor TS is provided in vacuum chamber 120 to monitor the temperature within interior 122 of vacuum chamber 120.

Target portion 42 includes a controller 200 that is operably connected to vacuum system 126, Xenon mass flow system 130, Xenon liquefier unit 140, Xenon recovery unit 150 (e.g., the cooling units 170 therein), temperature sensor TS and laser 12 of light source portion 41 of LPP target system 40 (see FIG. 4). An example controller 200 includes a personal computer that can store instructions (software) in a computer readable medium (memory) to cause the computer (via a processor therein) to carry out the instructions to operate LPP target system 40 to generate LPP 24.

With reference to FIG. 5A and FIG. 5B, in the operation of target portion 42, controller 200 sends a signal Sg0 to vacuum system 126, which causes the vacuum system 126 to pull a vacuum in interior 122 of vacuum chamber 120. Here it is assumed that vacuum chamber 120 is connected to or is part of a larger vacuum chamber (not shown) that houses LPP-GIC SOCOMO 100. Controller 200 also sends a signal Sg1 to Xenon mass flow system 130, which in response thereto provides a metered flow of Xenon gas 116G to Xenon liquefier unit 140 via the gas flow conduit 132.

Controller 200 also sends signals Sg2 to Xenon liquefier unit 140 and signals Sg3 to Xenon recovery unit 150 to cause these units 140 and 150 to condense the Xenon gas 116G and to initial the flow of Xenon liquid 116L through capillary tube 154 in the direction from the Xenon liquefier unit 140 to the Xenon recovery unit 150. In an example embodiment, this involves the activation of the corresponding cooling fluid sources 174 and the subsequent flow of cooling fluid through the corresponding cooling lines 172.

Controller 200 also sends a signal Sg4 to heater unit 166 in return conduit 160. The heat from heater unit 166 serves to convert Xenon liquid 116L to Xenon gas 116G, thereby forming a thermal siphon between the Xenon liquefier unit 140 and Xenon recovery unit 150.

Controller 200 additionally sends a signal Sg5 to laser 12 in light source portion 41 (FIG. 4) to initiate the formation of laser beam 13. Controller 200 also receives a temperature signals Sg6 from temperature sensor TS that contains temperature information for interior 122 of vacuum chamber 120. This temperature information is used in one embodiment to control the operation of cooling units 170 to control the respective temperatures of Xenon liquefier unit 140 and the Xenon recovery unit 150, as well as containment vessel 180.

When Xenon liquid 116L passes through capillary tube 154, a portion of the Xenon liquid 116L is exposed at aperture 158. Laser beam 13 is focused at aperture 158 so that the Xenon liquid 116L at the aperture 158 is irradiated by the focused laser beam 13 and forms LPP 24 (shown in phantom), which emits EUV radiation 30 generally in the +X direction.

The continual flow of Xenon liquid 116L past aperture 158 allows for high repetition rates and long run times for LPP 24. Some of the Xenon liquid 116L passes through capillary tube 154 without being irradiated by laser beam 13. This Xenon liquid 116L is collected in Xenon recovery unit 150 and recycled to Xenon liquefier unit 140 via the thermal siphoning action set up by heater unit 166 in return conduit 160.

As discussed above, temperature signal Sg6 from temperature sensor TS to controller 200 allows the controller 200 to control the temperature of interior 122 of vacuum chamber 120 and containment vessel 180 therein via the operation of the respective cooling units 170.

Advantages of the Xenon-based LPP target system 40 of the present disclosure include minimal debris formation from the Xenon liquid 116L, and relatively long run times in view of the large potential supply of Xenon and the essentially closed-loop fluid flow path.

SOCOMO with no First-mirror Multilayer

An example configuration of LPP-GIC SOCOMO 100 has no multilayer-coated "first mirror," i.e., the mirror or mirror section upon which EUV radiation 30 is first incident (i.e., first reflected) does not have a multilayer coating 18. In another example configuration of LPP-GIC SOCOMO 100, the first mirror is substantially a grazing incidence mirror. In other embodiments, the first mirror may include a multilayer coating 18.

Figure 6:
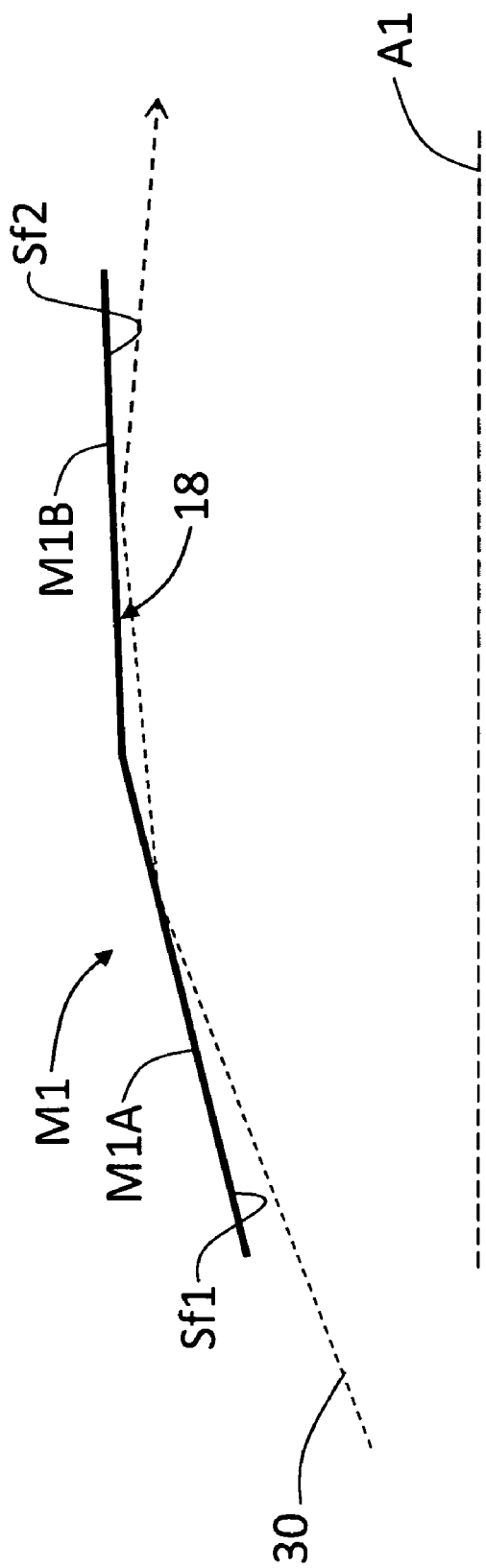
FIG. 6 is a cross-sectional diagram of an example GIC mirror having two sections with respective first and second surfaces that provide first and second reflections of EUV radiation.

A major advantage of LPP-GIC SOCOMO 100 is that its performance is not dependent upon on the survival of a multilayer coated reflective surface. Example embodiments of GIC mirror MG have at least one segmented GIC mirror shell, such as GIC mirror shell M1 shown in FIG. 6. GIC mirror shell M1 is shown as having a two mirror segments M1A and M1B with respective first and second surfaces Sf1 and Sf2. First surface Sf1 provides the first reflection (and is thus the "first mirror") and second surface Sf2 provides a second reflection that is not in the line of sight to LPP 24. In an example embodiment, second surface Sf2 supports a multilayer coating 18 since the intensity of the once-reflected EUV radiation 30 is substantially diminished and is not normally in the line of sight of LPP 24, thus minimizing the amount of ions and neutral atoms incident upon the multilayer coating 18.

GIC vs. NIC SOCOMOs

There are certain trade-offs associated with using a LPP-GIC SOCOMO 100 versus a LPP-NIC SOCOMO 10. For example, for a given collection angle of the EUV radiation 30 from the LPP 24, the LPP-NIC SOCOMO 10 can be designed to be more compact than the LPP-GIC SOCOMO 100.

Also, the LPP-NIC SOCOMO 10 can in principle be designed to collect EUV radiation 30 emitted from the source at angles larger than 90° (with respect to the optical axis A1), thus allowing larger collection efficiency. However, in practice this advantage is not normally used because it leads to excessive NIC diameters or excessive angles that the EUV radiation 30 forms with the optical axis A1 at intermediate focus IF.

Also, the far field intensity distribution generated by a LPP-GIC SOCOMO 100 has additional obscurations due to the shadow of the thickness of the GIC mirror shells M1 and M2 and of the mechanical structure supporting the GIC mirrors MG. However, the present disclosure discusses embodiments below where the GIC surface includes a surface correction that mitigates the shadowing effect of the GIC mirror shells thicknesses and improves the uniformity of the focus spot FS at the intermediate focus IF.

Further, the focus spot FS at intermediate focus IF will in general be larger for a LPP-GIC SOCOMO 100 than for a LPP-NIC SOCOMO 10. This size difference is primarily associated with GIC mirror figure errors, which are likely to decrease as the technology evolves.

On the whole, it is generally believed that the above-mentioned trade-offs are far outweighed by the benefits of a longer operating lifetime, reduced cost, simplicity, and reduced maintenance costs and issues associated with a LPP-GIC SOCOMO 100.

Example GIC Mirror for LPP-GIC SOCOMO

Figure 7:
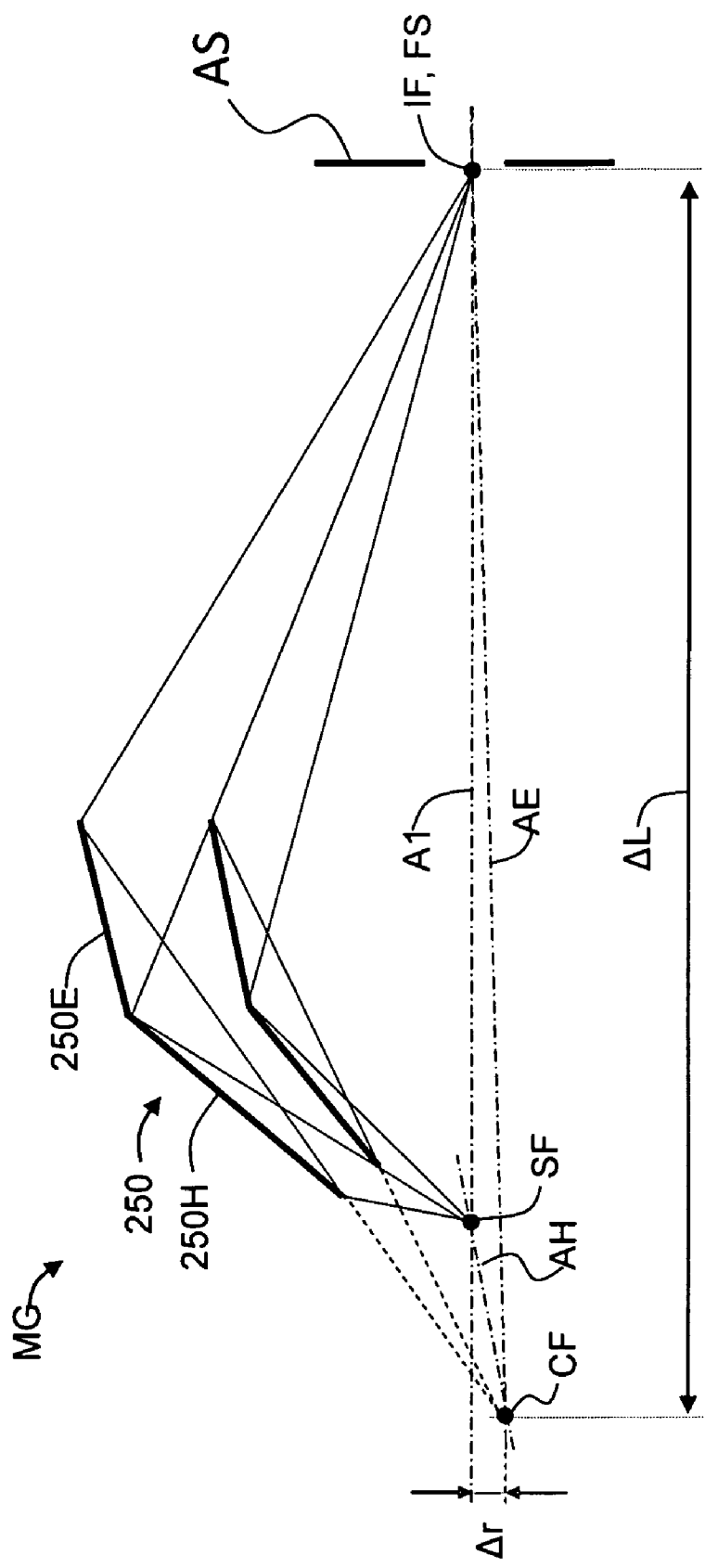
FIG. 7 is a schematic cross-sectional diagram of a portion of an example GIC mirror showing two of the two-section GIC mirror shells used in the outer portion of the GIC mirror.
Figure 8:
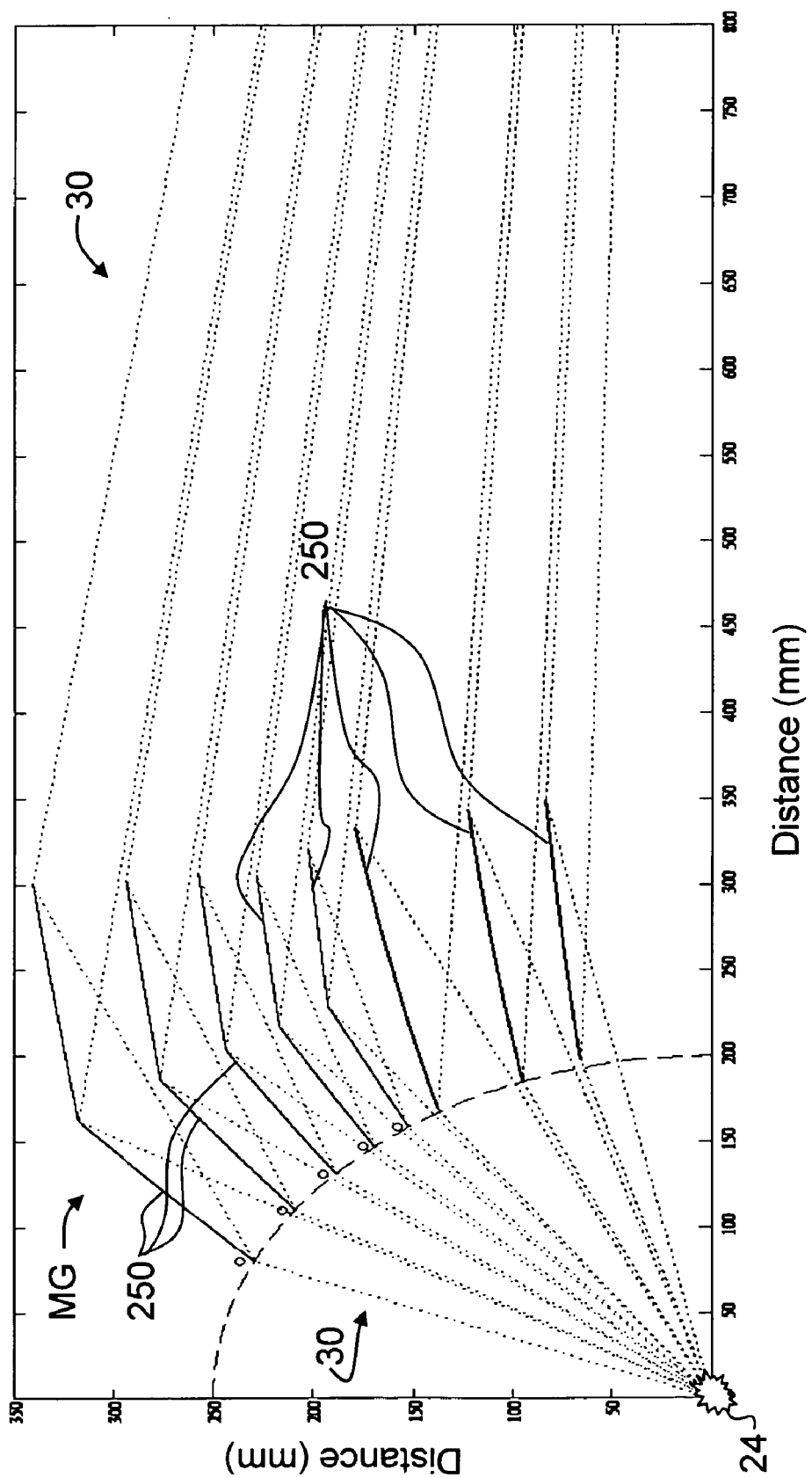
FIG. 8 is a schematic cross-sectional diagram of a portion of the GIC mirror of FIG. 7 showing all eight GIC mirror shells and the LPP.

FIG. 7 is a schematic side view of a portion of an example GIC mirror MG for use in LPP-GIC SOCOMO 100. By way of example, the optical design of GIC mirror MG of FIG. 7 actually consists of as many as eight or more nested GIC mirror shells 250 with cylindrical symmetry around the optical axis A1, as illustrated in FIG. 8. To minimize the number of GIC mirror shells 250, in the present example the first three innermost GIC mirror shells 250 are elliptical, whereas the five outermost GIC mirror shells 250 are based on an off-axis double-reflection design having elliptical and hyperbolic cross sections, such as described in European Patent Application Publication No. EP1901126A1, entitled "A collector optical system," which application is incorporated by reference herein. FIG. 7 shows two of the outermost GIC mirror shells 250 having an elliptical section 250E and a hyperboloidal section 250H. FIG. 7 also shows the source focus SF, the virtual common focus CF, and the intermediate focus IF, as well as the axes AE and AH for the elliptical and hyperboloidal sections 250E and 250H of GIC mirror shells 250, respectively. The distance between virtual common focus CF and intermediate focus IF is $\Delta L$. The (virtual) common focus CF is offset from the optical axis A1 by a distance $\Delta r$. The full optical surface is obtained by a revolution of the sections 250E and 250H around the optical axis A1.

Example designs for the example GIC mirror MG are provided in Table 1 and Table 2 below. The main optical parameters of the design are: a) a distance $\Delta L$ between LPP 24 and intermediate focus IF of 2400 mm; and b) a maximum collection angle at the LPP side of 70.7°. In an example embodiment, GIC mirror shells 250 each include a Ru coating for improved reflectivity at EUV wavelengths. The nominal collection efficiency of the GIC mirror MG for EUV radiation 30 of wavelength of 13.5 nm when the optical surfaces of GIC mirror shells 250 are coated with Ru is 37.6% with respect to $2\pi$ steradians emission from LPP 24.

Since an LPP EUV source is much smaller than a discharge-produced plasma (DPP) EUV source (typically by a factor of 10 in area), the use of LPP 24 allows for better etendue matching between the output of GIC mirror MG and the input of illuminator. In particular, the collection angle at LPP 24 can be increased to very large values with negligible or very limited efficiency loss due to mismatch between the GIC mirror MG and illuminator etendue. In an example embodiment, the collection half-angle can approach or exceed 70°.

The dimension of LPP 24 has a drawback in that the uniformity of the intensity distribution in the far field tend to be worse than for a DPP source, for a given collector optical design. Indeed, since the LPP 24 is smaller, the far-field shadows due to the thicknesses of GIC mirror shells 250 tend to be sharper for an LPP source than for a DPP source.

To compensate at least partially for this effect, a surface figure (i.e., optical profile) correction is added to each GIC mirror shell 250 to improve the uniformity of the intensity distribution in the far field (see, e.g., Publication No. WO2009-095219 A1, entitled "Improved grazing incidence collector optical systems for EUV and X-ray applications," which publication is incorporated by reference herein). Thus, in an example embodiment of GIC mirror MG, each GIC mirror shell 250 has superimposed thereon a polynomial (parabolic) correction equal to zero at the two edges of the GIC mirror shells 250 and having a maximum value of 0.01 mm.

Figure 10:
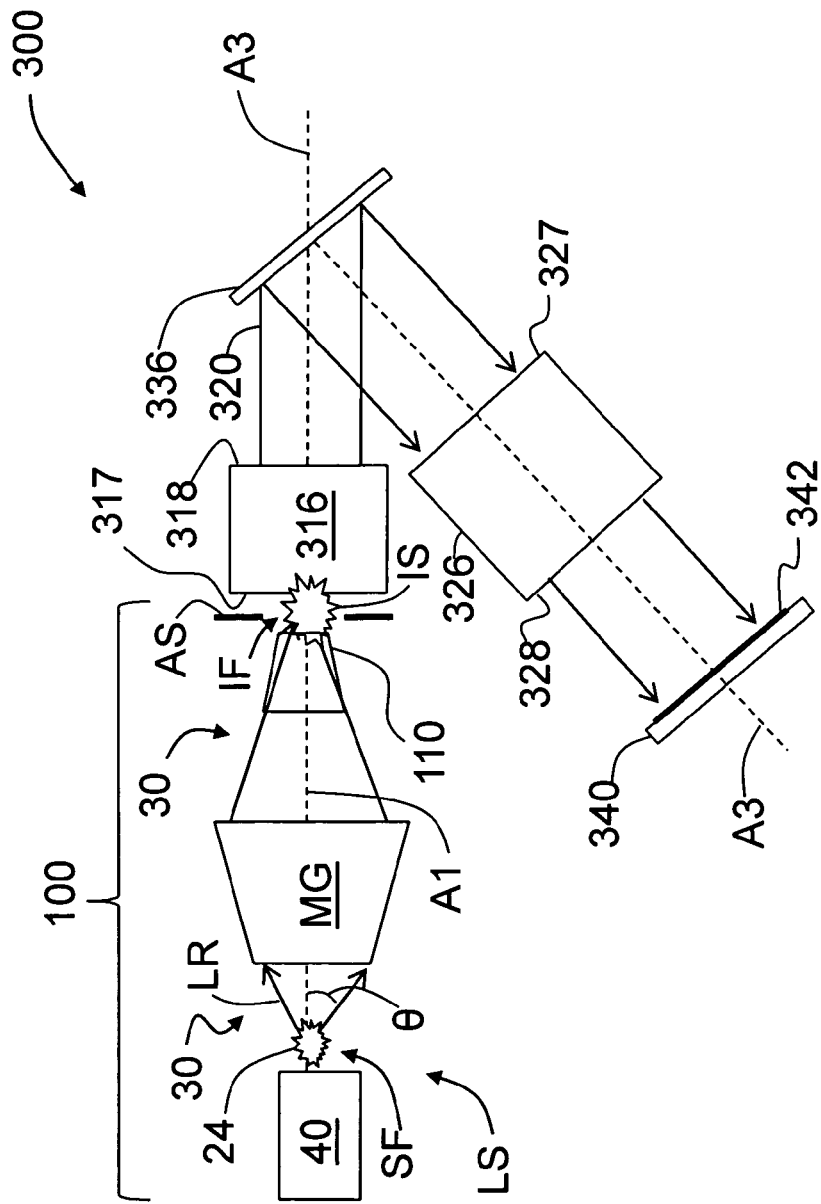
FIG. 10 is a schematic diagram of an EUV lithography system that utilizes the LPP-GIC SOCOMO of the present disclosure.

Table 1 and Table 2 set forth an example design for the GIC mirror MG shown in FIG. 10. The "mirror #" is the number of the particular GIC mirror shell 250 as numbered starting from the innermost GIC mirror shell 250 to the outermost GIC mirror shell 250.

TABLE 1

| | Hyperbola | | Ellipse | | Mirror radii [mm] | | |
|---|---|---|---|---|---|---|---|
| Mirror # | Conic Constant | Radius of curvature [mm] | Conic Constant | Radius of curvature [mm] | Maximum | Ellipse-hyperbola joint | Minimum |
| 1 | — | — | −0.990478 | 11.481350 | 83.347856 | — | 65.369292 |
| 2 | — | — | −0.979648 | 24.674461 | 122.379422 | — | 94.644337 |
| 3 | — | — | −0.957302 | 52.367323 | 179.304368 | — | 137.387744 |
| 4 | −1.066792 | 29.401382 | −0.963621 | 61.100890 | 202.496127 | 192.634298 | 152.384167 |
| 5 | −1.072492 | 34.268782 | −0.949865 | 86.379783 | 228.263879 | 216.839614 | 169.639161 |
| 6 | −1.090556 | 46.865545 | −0.941216 | 104.704248 | 257.297034 | 243.541412 | 188.559378 |
| 7 | −1.111163 | 61.694607 | −0.926716 | 134.626393 | 293.432077 | 276.198514 | 208.671768 |
| 8 | −1.134540 | 81.393448 | −0.905453 | 180.891785 | 340.258110 | 317.294990 | 229.102808 |

TABLE 2

| | Position of virtual common focus CF with respect to intermediate focus IF | |
|---|---|---|
| Mirror # | ΔL, parallel to optical axis A1 [mm] | Δr, transverse to optical axis A1 [mm] |
| 1 | — | — |
| 2 | — | — |
| 3 | — | — |
| 4 | 3293.000000 | 171.500000 |
| 5 | 3350.000000 | 237.000000 |
| 6 | 3445.000000 | 276.300000 |
| 7 | 3521.000000 | 335.250000 |
| 8 | 3616.000000 | 426.950000 |

Figure 9B:
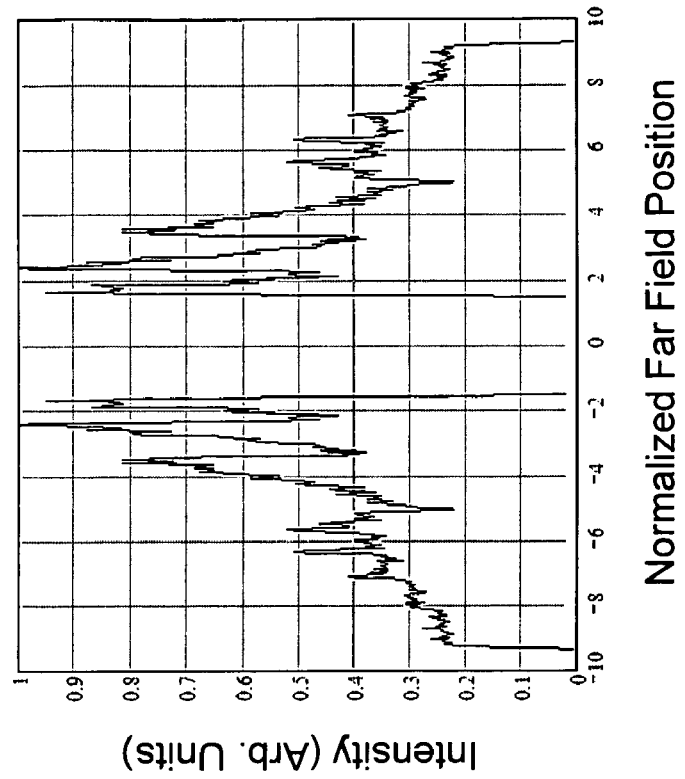
FIG. 9B is the same plot as FIG. 9A but with a polynomial surface-figure correction that improves the far-field image uniformity.
Figure 9A:
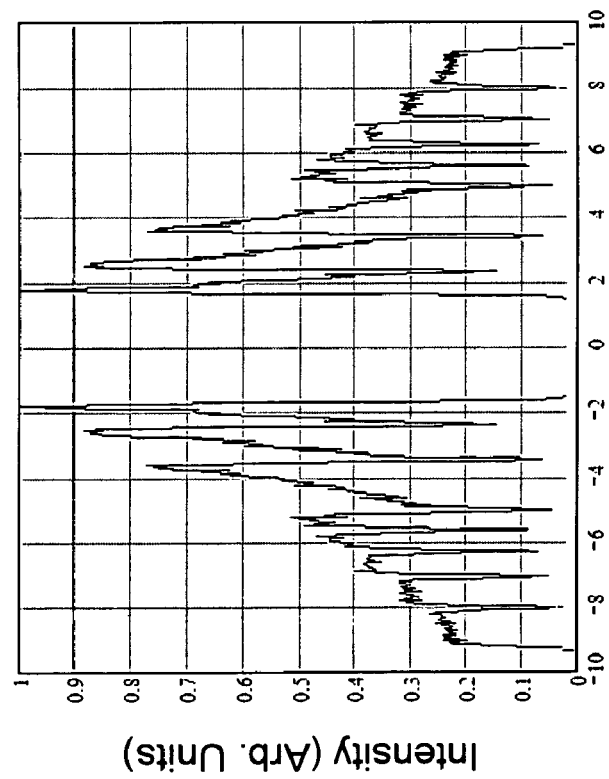
FIG. 9A is a plot of the normalized far-field position vs. Intensity (arbitrary units) for the case where the GIC mirror shells do not include a polynomial surface-figure correction to improve the far-field image uniformity.

FIG. 9A is a plot of the normalized far-field position at the intermediate focus IF vs. intensity (arbitrary units) for light rays incident thereon for the case where there is no correction of the GIC shell profile. The plot is a measure of the uniformity of the intermediate image (i.e., "focus spot" FS) of LPP 24 as formed at the intermediate focus IF. LPP 24 is modeled as a sphere with a 0.2 mm diameter.

FIG. 9B is the same plot except with the above-described correction added to GIC mirror shells 250. The comparison of the two plots of FIG. 9A and FIG. 9B shows substantially reduced oscillations in intensity in FIG. 9B and thus a significant improvement in the far field uniformity the focus spot FS at the intermediate focus IF as a result of the corrected surface figures for the GIC mirror shells 250.

EUV Lithography System with LPP-GIC SOCOMO

FIG. 10 is an example EUV lithography system ("lithography system") 300 according to the present disclosure. Example EUV lithography systems 300 are disclosed, for example, in U.S. Patent Applications No. US2004/0265712A1, US2005/0016679A1 and US2005/0155624A1, which are incorporated herein by reference.

Lithography system 300 includes a system axis A3 and an EUV light source LS that includes LPP-GIC SOCOMO 100 with optical axis A1 and having the Xe-liquid-based LPP target system 40 as described above, which generates LPP 24 that emits working EUV radiation 30 at λ=13.5 nm.

LPP-GIC SOCOMO 100 includes GIC mirror MG and optional RCED 110 as described above. In an example embodiment, GIC mirror MG is cooled as described in U.S. patent application Ser. No. 12/592,735, which is incorporated by reference herein. Also in an example, RCED 110 is cooled.

GIC mirror MG is arranged adjacent and downstream of EUV light source LS, with optical (collector) axis A1 lying along system axis A3. GIC mirror MG collects working EUV radiation 30 (i.e., light rays LR) from EUV light source LS located at source focus SF and the collected radiation forms source image IS (i.e., a focus spot) at intermediate focus IF. RCED 110 serves to enhance the collection of EUV radiation 30 by funneling to intermediate focus IF the EUV radiation 30 that would not otherwise make it to the intermediate focus IF. In an example, LPP-GIC SOCOMO 100 comprises LPP target system 40, GIC mirror MG and RCED 110.

An embodiment of RCED 110 as discussed above in connection with FIG. 3B includes at least one funnel element 111. In one example, funnel element 111 is a downstream funnel element 111D configured to direct EUV radiation 30 from focus spot FS at intermediate focus IF to a downstream location, such as the illumination optics (illuminator) downstream of the intermediate focus IF. In another example, funnel element 111 is an upstream funnel element 111U that directs EUV radiation 30 to form focus spot FS at intermediate focus IF, including collecting radiation that would not otherwise participate in forming the focus spot FS. In an example, RCED 110 includes both upstream and downstream funnel elements 111U and 111D. RCED 110 serves to make the projected radiation at the illuminator more uniform and thereby better utilized at the reticle plane.

An illumination system 316 with an input end 317 and an output end 318 is arranged along system axis A3 and adjacent and downstream of EUV GIC mirror MG with the input end adjacent the GIC mirror MG. Illumination system 316 receives at input end 317 EUV radiation 30 from source image IS and outputs at output end 318 a substantially uniform EUV radiation beam 320 (i.e., condensed EUV radiation). Where lithography system 300 is a scanning type system, EUV radiation beam 320 is typically formed as a substantially uniform line of EUV radiation 30 at reflective reticle 336 that scans over the reflective reticle 336.

A projection optical system 326 is arranged along (folded) system axis A3 downstream of illumination system 316. Projection optical system 326 has an input end 327 facing output end 318 of illumination system 316, and an opposite output end 328. A reflective reticle 336 is arranged adjacent the input end 327 of projection optical system 326 and a semiconductor wafer 340 is arranged adjacent the output end 328 of projection optical system 326. Reflective reticle 336 includes a pattern (not shown) to be transferred to semiconductor wafer 340, which includes a photosensitive coating (e.g., photoresist layer) 342. In operation, the uniformized EUV radiation beam 320 irradiates reflective reticle 336 and reflects therefrom, and the pattern thereon is imaged onto photosensitive coating 342 of semiconductor wafer 340 by projection optical system 326. In a scanning type lithography system 300, the reflective reticle image scans over the photosensitive coating 342 to form the pattern over the exposure field. Scanning is typically achieved by moving reflective reticle 336 and semiconductor wafer 340 in synchrony.

Once the reticle pattern is imaged and recorded on semiconductor wafer 340, the patterned semiconductor wafer 340 is then processed using standard photolithographic and semiconductor processing techniques to form integrated circuit (IC) chips.

Note that in general the components of lithography system 300 are shown lying along a common folded system axis A3 in FIG. 10 for the sake of illustration. One skilled in the art will understand that there is often an offset between entrance and exit axes for the various components such as for illumination system 316 and for projection optical system 326.

It will be apparent to those skilled in the art that various modifications and variations can be made to the present disclosure without departing from the spirit and scope of the disclosure. Thus it is intended that the present disclosure cover the modifications and variations of this disclosure provided they come within the scope of the appended claims and their equivalents.

What is claimed is:

1. A source-collector module for an extreme ultraviolet (EUV) lithography system, comprising:
    a laser that generates a pulsed laser beam;
    a fold mirror arranged along a source-collector module axis and configured to receive the pulsed laser beam and reflect the pulsed laser beam down the source-collector module axis in a first direction;
    a Xenon liquid source configured to provide Xenon liquid at an irradiation location where the Xenon liquid is irradiated by the pulsed laser beam, thereby creating a laser-produced plasma (LPP) that generates EUV radiation in a second direction that is generally opposite the first direction;
    a grazing-incidence collector (GIC) mirror having an input end and an output end and arranged to receive the EUV radiation at the input end and focus the received EUV radiation at an intermediate focus adjacent the output end;
    a Xenon mass flow system configured to provide a metered flow of Xenon gas through a gas flow conduit;
    a Xenon liquefier unit fluidly connected to the Xenon mass flow system via the gas flow conduit and configured to liquefy the Xenon gas to form Xenon fluid; and
    a Xenon recovery unit fluidly connected to the Xenon liquefier unit via a capillary tube that allows for Xenon fluid to flow from the Xenon liquefier unit to the Xenon recovery unit, wherein the capillary tube includes an aperture that allows the laser beam to be incident upon the Xenon fluid at the irradiation location.

2. The source-collector module of claim 1, further comprising a cooled containment vessel that includes the Xenon liquefier unit.

3. The source-collector module of claim 1, wherein the Xenon liquefier unit and the Xenon recovery unit are fluidly connected so that Xenon gas flows from the Xenon recovery unit to the Xenon liquefier unit.

4. An extreme ultraviolet (EUV) lithography system for illuminating a reflective reticle, comprising:
    the source-collector module claim 1;
    an illuminator configured to receive the focused EUV radiation formed at the intermediate focus and form condensed EUV radiation for illuminating the reflective reticle.

5. The EUV lithography system of claim 4 further comprising a radiation collection enhancement device (RCED) arranged adjacent the intermediate focus, the RCED having at least one funnel element axially arranged on at least one side of the intermediate focus, with the at least one funnel element having a narrow end closest to the intermediate focus, wherein the RCED serves to provide more EUV radiation to the illuminator than when the RCED is absent.

6. The EUV lithography system of claim 5 for forming a patterned image on a photosensitive semiconductor wafer, further comprising:
    a projection optical system arranged downstream of the reflective reticle and configured to receive reflected EUV radiation from the reflective reticle and form therefrom the patterned image on the photosensitive semiconductor wafer.

7. The source-collector module of claim 1, further comprising a radiation collection enhancement device (RCED) arranged adjacent the intermediate focus, the RCED having at least one funnel element axially arranged on at least one side of the intermediate focus, with the at least one funnel element having a narrow end closest to the intermediate focus.

8. The source-collector module of claim 7, wherein the RCED includes first and second funnel elements arranged on respective sides of the intermediate focus.

9. The source-collector module of claim 1, wherein the GIC mirror provides a first reflecting surface that does not have a multilayer coating.

10. The source-collector module of claim 1, wherein the GIC mirror includes one of a Ru coating and a multilayer coating.

11. The source-collector module of claim 1, wherein the GIC mirror includes at least one segmented GIC shell having a first reflecting surface with no multilayer coating and a second reflecting surface having a multilayer coating.

12. A method of collecting extreme ultraviolet (EUV) radiation from a laser-produced plasma (LPP), comprising:
    providing a grazing incidence collector (GIC) mirror along an axis, the GIC mirror having input and output ends;
    arranging adjacent the input end of the GIC mirror an LPP target system configured to provide Xenon liquid through a capillary tube, and moving the Xenon liquid past an irradiation location;
    sending a pulsed laser beam down the axis of the GIC mirror and through the GIC mirror from the output end to the input end and to the Xenon liquid at the irradiation location, thereby forming the LPP that emits the EUV radiation; and
    collecting with the GIC mirror at the input end of the GIC mirror a portion of the EUV radiation from the LPP and directing the collected EUV radiation out of the output end of the GIC mirror to form a focus spot at an intermediate focus.

13. The method of claim 12, further comprising:
    providing a radiation collection enhancement device (RCED) arranged adjacent the intermediate focus, the RCED having at least one funnel element axially arranged on at least one side of the intermediate focus, with the at least one funnel element having a narrow end closest to the intermediate focus.

14. The method of claim 12, further comprising:
    providing an upstream funnel element between the output end of the GIC and the intermediate focus and directing with the upstream funnel element a portion of the EUV radiation to the intermediate focus that would not otherwise be directed to the intermediate focus; and
    providing a downstream funnel element adjacent the intermediate focus opposite the GIC mirror so as to collect EUV radiation from the intermediate focus and direct it to a downstream location.

15. The method of claim 12, further comprising:
providing the GIC mirror with a first reflecting surface that does not have a multilayer coating.

16. The method of claim 12, further comprising:
providing the GIC mirror with one of a Ru coating and a multilayer coating.

17. The method of claim 12, further comprising:
providing the GIC mirror with at least one segmented GIC shell that includes a first reflecting surface and a second reflecting surface, with the second reflecting surface having the multilayer coating.

18. The method of claim 17, further comprising:
forming from EUV radiation at the intermediate focus condensed EUV radiation for illuminating a reflective reticle.

19. A laser produced plasma (LPP) target system, comprising:
a laser that generates a pulsed laser beam; and
a Xenon liquid source configured to flow Xenon liquid through a capillary tube and past an irradiation location at which the pulse laser beam irradiates the liquid Xenon to produce extreme ultraviolet (EUV) radiation.

20. The LPP target system of claim 19, further comprising:
a Xenon mass flow system configured to provide a metered flow of Xenon gas through a gas flow conduit;
a Xenon liquefier unit fluidly connected to the Xenon mass flow system via the gas flow conduit and configured to liquefy the Xenon gas to form Xenon fluid; and
a Xenon recovery unit fluidly connected to the Xenon liquefier unit via the capillary tube that allows for Xenon fluid to flow from the Xenon liquefier unit to the Xenon recovery unit, wherein the capillary tube includes an aperture that allows the laser beam to be incident upon the Xenon fluid at the irradiation location.

* * * * *